(12) United States Patent
Hashimoto

(10) Patent No.: US 10,812,688 B2
(45) Date of Patent: Oct. 20, 2020

(54) IMAGING APPARATUS

(71) Applicant: DENSO CORPORATION, Kariya, Aichi-pref. (JP)

(72) Inventor: Marie Hashimoto, Kariya (JP)

(73) Assignee: DENSO CORPORATION, Kariya, Aichi-Pref. (JP)

(\*) Notice: Subject to any disclaimer, the term of this patent is extended or adjusted under 35 U.S.C. 154(b) by 0 days.

(21) Appl. No.: 16/127,683

(22) Filed: Sep. 11, 2018

(65) Prior Publication Data
US 2019/0082082 A1 Mar. 14, 2019

(30) Foreign Application Priority Data
Sep. 11, 2017 (JP) ................. 2017-173917

(51) Int. Cl.
| | | |
|---|---|---|
| H04N 5/225 | (2006.01) | |
| H05K 9/00 | (2006.01) | |
| B60R 11/04 | (2006.01) | |
| B60R 11/00 | (2006.01) | |

(52) U.S. Cl.
CPC .......... *H04N 5/2252* (2013.01); *B60R 11/04* (2013.01); *H05K 9/0015* (2013.01); *H05K 9/0081* (2013.01); *B60R 2011/0026* (2013.01); *H04N 5/2253* (2013.01)

(58) Field of Classification Search
CPC ........ B60W 2420/403; B60W 2420/42; B60Y 2400/3015; B60R 11/04; B60R 2001/1253; B60R 2300/00–108

USPC ..... 348/373, 375, 335, 164, 216.1; 396/427, 396/419
See application file for complete search history.

(56) References Cited

U.S. PATENT DOCUMENTS

| | | | |
|---|---|---|---|
| 2009/0223711 A1 | 9/2009 | Ueno et al. | |
| 2014/0132768 A1* | 5/2014 | Choi | H04N 5/2252 348/148 |
| 2015/0015713 A1 | 1/2015 | Wang et al. | |
| 2015/0281528 A1* | 10/2015 | Li | H04N 5/2253 348/357 |
| 2015/0327398 A1* | 11/2015 | Achenbach | B60R 1/00 348/148 |
| 2016/0307953 A1* | 10/2016 | Kono | H01L 27/14618 |
| 2018/0148000 A1* | 5/2018 | Nakamura | B60R 11/04 |

FOREIGN PATENT DOCUMENTS

| | | |
|---|---|---|
| JP | S60-166197 A | 8/1985 |
| JP | 2007-274624 A | 10/2007 |
| JP | 2009-212446 A | 9/2009 |

(Continued)

*Primary Examiner* — Xi Wang
(74) *Attorney, Agent, or Firm* — Maschoff Brennan

(57) ABSTRACT

In an imaging apparatus mounted in a vehicle, a housing containing an imaging module includes a first housing member having an opening and a first facing surface along a perimeter of the opening, and a second housing member disposed to cover the opening and having a second facing surface facing the first facing surface. The housing further includes an electrically conductive bonding member disposed between the first facing surface and the second facing surface and at least partially along the perimeter of the opening, and adapted to adhere to both the first facing surface and the second facing surface and electrically connect the first housing member and the second housing member.

12 Claims, 7 Drawing Sheets

(56) References Cited

FOREIGN PATENT DOCUMENTS

| JP | 2012-047816 A | 3/2012 |
| JP | 2018-087916 A | 6/2018 |
| WO | 2013/123161 A1 | 8/2013 |

\* cited by examiner

IMAGING APPARATUS

CROSS-REFERENCE TO RELATED APPLICATION

This application is based on and claims the benefit of priority from earlier Japanese Patent Application No. 2017-173917 filed on Sep. 11, 2017, the description of which is incorporated herein by reference.

BACKGROUND

Technical Field

This disclosure relates to an imaging apparatus.

Related Art

International Patent Application Publication WO 2013/123161 discloses a camera module attachable to a vehicle front windshield. This camera module includes a housing, which contains an imaging element, a circuit board and other components. The housing includes an upper cover and a lower cover, each having an opening. The upper cover and the lower cover are fastened by a fastener, with the openings of the upper and lower covers facing each other.

Screws may be used as fasteners to fasten the upper cover and the lower cover. Alternatively, the upper cover and the lower cover may be fastened without using fasteners, for example, by crimping.

However, fastening methods using screws or crimping may cause generation of a gap between the opening of the upper cover and the opening of the lower cover at other than fastener portions. Depending on size of the gap, ingress of electromagnetic noise into the housing through the gap may adversely affect the operations of the camera module, or leakage of electromagnetic noise generated in the housing out of the housing through the gap may adversely affect external devices.

In view of the above, it is desired to have techniques for preventing leakage of electromagnetic waves out of an imaging apparatus and ingress of electromagnetic waves into the imaging apparatus.

SUMMARY

One aspect of the disclosure provides an imaging apparatus mounted in a vehicle. The imaging apparatus includes: a housing having a cavity thereinside; an imaging module that is at least partially contained in the cavity and configured to capture an image of an imaging target and output an image signal representing the image of the imaging target; and a signal processor that is contained in the cavity and configured to process the image signal output from the imaging module.

The housing includes: a first housing member having an opening and a first facing surface along a perimeter of the opening; a second housing member disposed to cover the opening, the second housing member having a second facing surface facing the first facing surface; and an electrically conductive bonding member disposed between the first facing surface and the second facing surface and at least partially along the perimeter of the opening, and adapted to adhere to both the first facing surface and the second facing surface and electrically connect the first housing member and the second housing member.

As above, the first housing member and the second housing member are joined and electrically connected by means of the electrically conductive bonding member therebetween. With this configuration, leakage of electromagnetic waves out of the housing and ingress of external electromagnetic waves into the housing can be prevented.

DESCRIPTION OF SPECIFIC EMBODIMENTS

Figure 1:
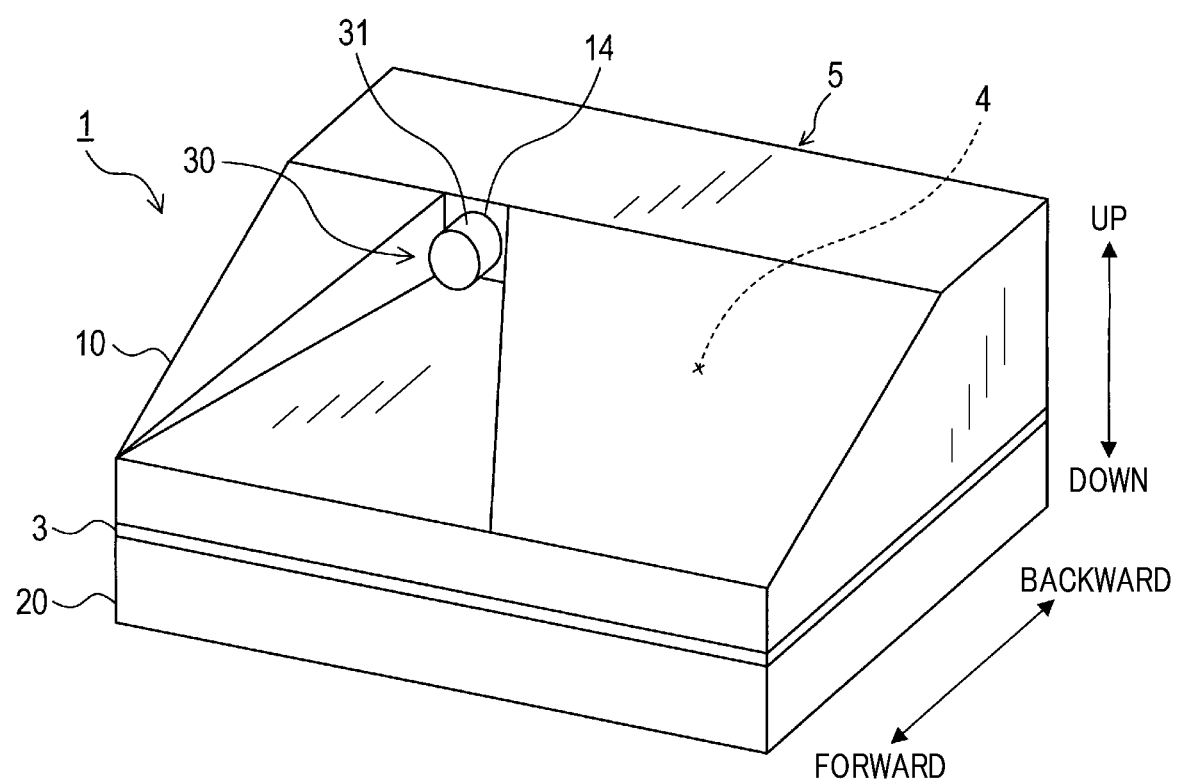
FIG. 1 is a perspective view of an imaging apparatus in accordance with a first embodiment of the present disclosure.

Hereinafter, exemplary embodiments of the present disclosure will be described in detail with reference to the accompanying drawings, in which like reference numerals refer to like or similar elements regardless of reference numerals and duplicated description thereof will be omitted.

1. FIRST EMBODIMENT 1-1. Overall Configuration

A configuration of an imaging apparatus 1 in accordance with a first embodiment of the present disclosure will now be described with reference to FIGS. 1 and 2. The imaging apparatus 1 is installed inside a windshield of a vehicle to capture images in the forward direction of the vehicle. In the following description, the term "vertical direction" for each member of the imaging apparatus 1 refers to a vertical direction of the member in a state where the imaging apparatus 1 is installed inside the windshield.

As shown in FIG. 1, the imaging apparatus 1 includes a housing 5 and an imaging module 30. The imaging apparatus 1 has a cavity 4 within the housing 5. The cavity 4, as shown in FIG. 2, contains a main circuit board 40.

1-2. Configuration of Housing

The housing 5 includes a first housing member 10, a second housing member 20, and a bonding member 3. The housing 5 is an assembly of the first housing member 10 and the second housing member 20. Each of the first housing member 10 and the second housing member 20 is an electrical conductor. More specifically, each of the first housing member 10 and the second housing member 20 is formed of an aluminum-based material, such as an aluminum alloy.

Figure 2:
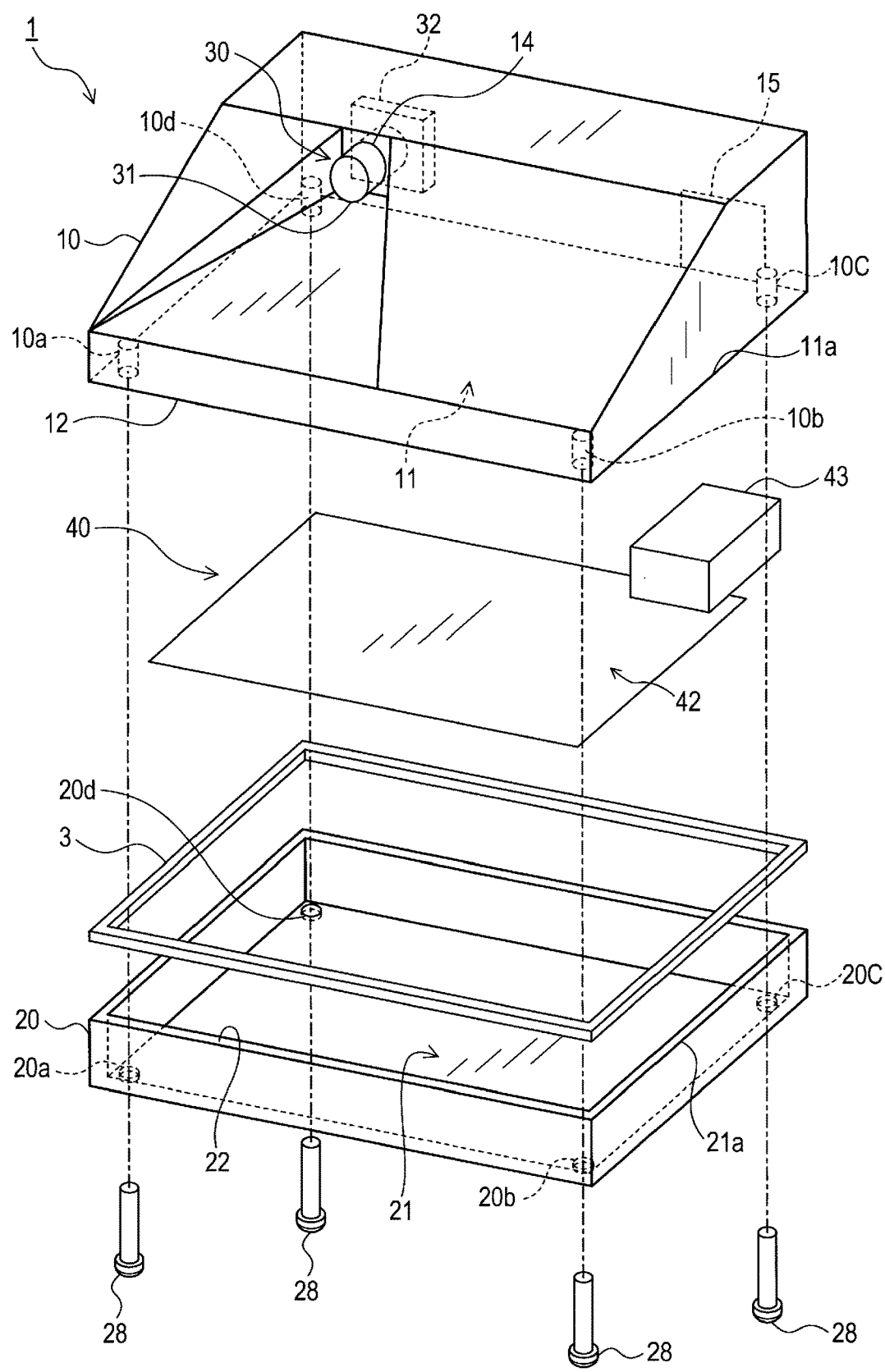
FIG. 2 is an exploded, perspective view of the imaging apparatus of the first embodiment.

As shown in FIG. 2, the first housing member 10 has a first opening 11. The first opening 11 has a first opening perimeter 11a that is a perimeter of the first opening 11. A first facing surface 12 of the first housing member 10 is provided circumferentially along the first opening perimeter 11a of the first opening 11.

The second housing member 20 is disposed so as to cover the first opening 11 of the first housing member 10. More specifically, the second housing member 20 has a second opening 21 facing the first opening 11. The second opening 21 has a second opening perimeter 21a that is a perimeter of the second opening 21.

A second facing surface 22 of the second housing member 20 is provided circumferentially along the second opening perimeter 21a of the second opening 21. The first housing member 10 and the second housing member are assembled to form the housing 5 with the first facing surface 12 of the first housing member 10 and the second facing surface 22 of the second housing member 20 facing each other on the perimeter of the second opening 21.

Figure 4:
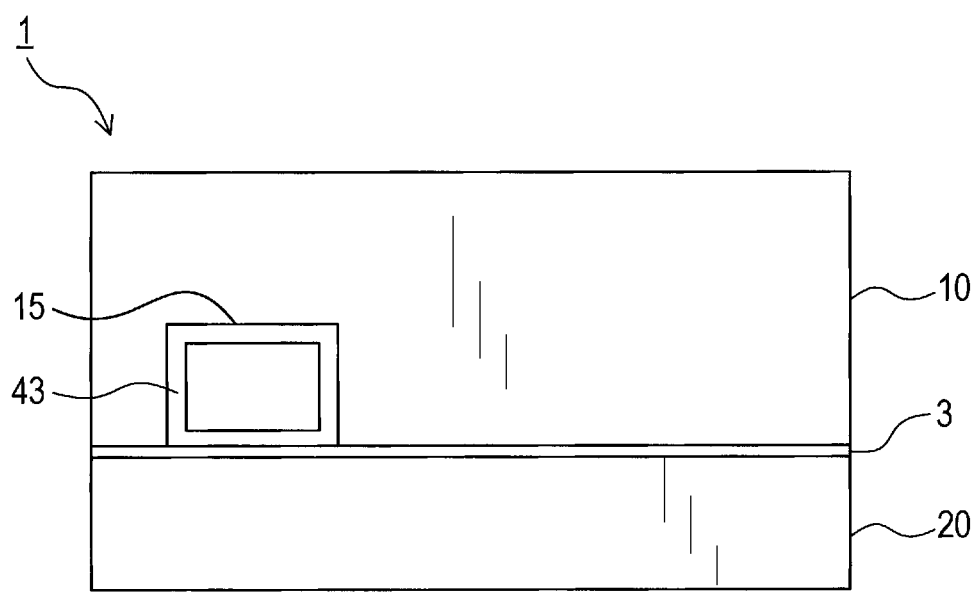
FIG. 4 is a rear view of the imaging apparatus of the first embodiment.

As shown in FIGS. 2 and 4, a connector aperture 15 is formed on the rear surface of the first housing member 10. The connector aperture 15 has a generally rectangular shape such that part of the first opening perimeter 11a corresponding to the lower side of the rectangle is cut out. Therefore, the first facing surface 12 is formed on a portion of the first opening perimeter 11a excluding the part where the connector aperture 15 is formed.

The second facing surface 22 of the second housing member 20 is formed on the entire second opening perimeter 21a. The first housing member 10 and the second housing member 20 are assembled to form the housing 5 with the first facing surface 12 and the second facing surface 22 facing each other and with a portion of the second facing surface 22 excluding the part where the connector aperture 15 of the first housing member 10 is formed facing the first facing surface 12.

The connector aperture 15 may be formed anywhere on the housing 5. For example, the connector aperture 15 may be formed on the rear surface of the first housing member 10 and above the first opening perimeter 11a. In such an embodiment, like the second facing surface 22, the first facing surface 12 may be formed throughout the entire first opening perimeter 11a, such that the first facing surface 12 and the second facing surface 22 face each other throughout the entire perimeter of the first opening 11 and the second opening 21.

The bonding member 3 is an electrically conductive member interposed between the first housing member 10 and the second housing member 20 to close off a gap therebetween and electrically connect the first housing member 10 and the second housing member 20.

The bonding member 3 is interposed between the first facing surface 12 of the first housing member 10 and the second facing surface 22 of the second housing member 20 throughout the entire perimeter of the first facing surface 12 and the second facing surface 22. The bonding member 3 has a thin tape shape, as a whole, a rectangle ring shape.

Figure 3:
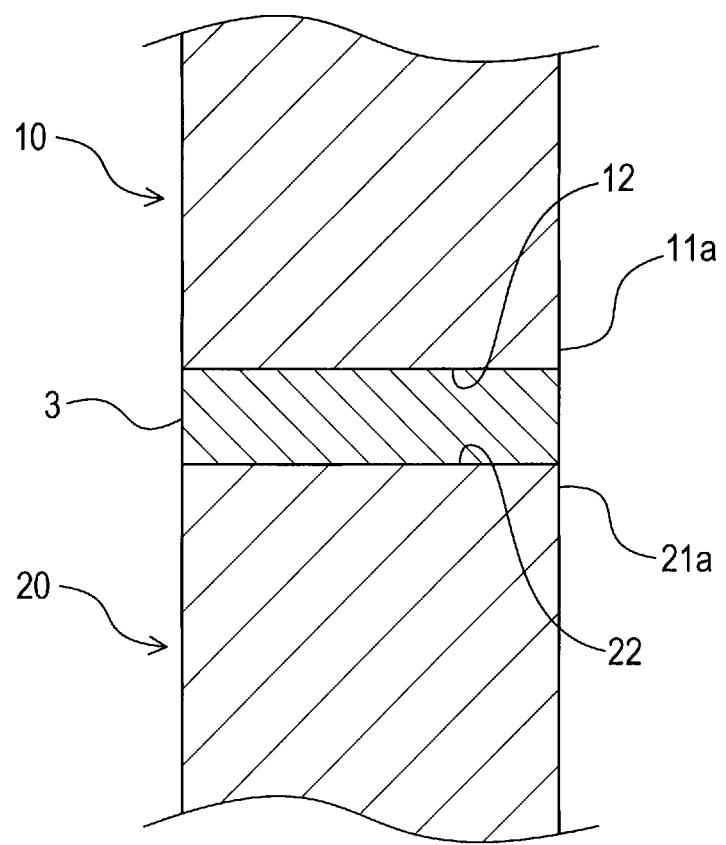
FIG. 3 is a cross-sectional view of a bonding layer and its surroundings of the imaging apparatus of the first embodiment.

As shown in FIG. 3, the bonding member 3 is adhered to the first facing surface 12 and the second facing surface 22 and electrically connects the first housing member 10 and the second housing member 20. For example, the first housing member 10 and the second housing member 20 may be coupled in series.

In the present embodiment, each of the first facing surface 12 and the second facing surface 22 faces and adheres to the bonding member 3 throughout its entire perimeter.

An external connector 43 is received into the connector aperture 15 that is formed in the rear surface of the first housing member 10 to close off the connector aperture 15. The external connector 43 is positioned such that its rear end face lies flush with the rear surface of the first housing member 10. As shown in FIG. 4, at least part of a surface of the bonding member 3, facing the first housing member 10, adheres to a bottom surface of the external connector 43.

A diagonal length of the connector aperture 15 is equal to or less than $\lambda/2$. $\lambda$ is a wavelength of a highest frequency signal among various signals used in vehicle mounted devices. For example, a frequency band of signals used in a vehicle mounted device for vehicle-to-infrastructure communications is a highest frequency band for vehicle use, including, for example, 2.5 GHz where $\lambda/2$ is about 60 mm.

As above, the diagonal length of the connector aperture 15 set equal to or less than $\lambda/2$. Even if there is a gap between the connector aperture 15 and the external connector 43 or between the external connector 43 and the bonding member 3, not only leakage of electromagnetic waves of wavelength greater than $\lambda$ out of the housing 5 through the gap, but also ingress of external electromagnetic waves of greater wavelength than A into the housing 5 through the gap can be prevented.

The bonding member 3 may be any type of electrically conductive member that can electrically connect the first housing member 10 and the second housing member 20.

The bonding member 3 includes an adhesive. The bonding member 3 itself has an adhesive property. Therefore, a surface of the bonding member 3, facing the first facing surface 12, can be adhered to the first facing surface 12 with sufficient adherence. Another surface of the bonding member 3, facing the second facing surface 22, is also adhered to the second facing surface 22 with sufficient adherence.

The bonding member 3 may be a soft member or a hard member. The bonding member 3 may be a member that is soft or in paste form in its initial state and then harden under heat or over time.

At an interface between the first housing member 10 and the second housing member 20, the first facing surface 12 of the first housing member 10 is adhered to the bonding member 3 throughout the entire opening perimeter 11a, and the second facing surface 22 of the second housing member 20 is adhered to the bonding member 3 throughout the entire opening perimeter 21a, whereby a gap between the first facing surface 12 of the first housing member 10 and the second facing surface 22 of the second housing member 20 is closed off by the bonding member 3. Leakage of electromagnetic waves generated by components inside the housing 5 out of the housing 5 can be prevented. Ingress of external electromagnetic waves into the housing 5 can also be prevented.

1-3. Configuration of Imaging Module

The imaging module 30 is configured to capture forward images of the vehicle and output image signals representing the captured forward images. The imaging module 30 includes a lens 31 and an imaging substrate 32. The imaging substrate 32 is provided with a light receiving element (not shown).

The housing 5 has a lens aperture 14. The imaging module 30 is contained within a cavity 4 of the housing 5. Part of the lens 31 is exposed externally of the housing 5 through the lens aperture 14.

In an alternative embodiment, at least one component of the imaging module 30, other than the lens 31, may be exposed externally of the housing 5. In another alternative embodiment, the entire imaging module 30, including the lens 31, may be contained within the housing 5, where, for example, the housing 5 may include a transparent portion proximate the lens 31 such that light may be incident on the lens 31 through the transparent portion of the housing 5.

In the present embodiment, a longitudinal direction refers to a direction in which part of the imaging module 30 is exposed from the lens aperture 14. As used herein the term "lateral direction" refer to a lateral direction of the imaging apparatus 1 as viewed from the imaging apparatus 1 looking forward. The imaging apparatus 1 may be installed such that the forward direction and the travel direction of the vehicle coincide.

Light from an imaging target is incident on the lens 31. The light from the imaging target travels to a light receiving element via the lens 31 and received by the light receiving element. The light receiving element outputs a signal responsive to the received light. The light receiving element may be a semiconductor image sensor element, such as a complementary metal-oxide semiconductor (CMOS) image sensor or the like.

A signal output circuit is provided on the imaging substrate 32. The signal output circuit is configured to output an image signal representing an image of the imaging target based on the light incident on the lens 31, more specifically, based on a signal output from the light receiving element. The image signal output from the imaging module 30 is input to the main circuit board 40.

1-4. Configuration of Main Circuit Board

As shown in FIG. 2, the main circuit board 40 includes a signal processing circuit 42 and the external connector 43. The signal processing circuit 42, as a signal processor, processes image signals output from the imaging module 30. The external connector 43 inputs external signals to the signal processing circuit 42 and outputs processing results of the signal processing circuit 42.

1-5. Housing Assembling Procedure

The first housing member 10 has four screw holes 10a, 10b, 10c, 10d, to join the first housing member 10 and the second housing member 20 together. The second housing member 20 has four through holes 20a, 20b, 20c, 20d positioned opposite the respective screw holes 10a, 10b, 10c, 10d, to join the second housing member 20 and the first housing member 10 together.

The first housing member 10 and the second housing member 20 are not only joined adhesively by the bonding member 3, but also secured mechanically by the four screws 28 as fasteners.

The assembling procedure of the housing 5 is as follows. For example, the bonding member 3 is applied to the first facing surface 12 of the first housing member 10 or the second facing surface 22 of the second housing member 20, whereby the bonding member 3 is adhered to the first facing surface 12 of the first housing member 10 or the second facing surface 22 of the second housing member 20.

Subsequently, the first housing member 10 and the second housing member 20 are combined such that the facing surfaces 12, 22 face each other, whereby the first facing surface 12 and the second facing surface 22 are both adhered to the bonding member 3.

When thermal hardening (or curing) of the bonding member 3 is needed, the bonding member 3 undergoes a thermal hardening treatment. In a configuration where the bonding member 3 is to be thermally hardened, the bonding member 3 is heated to be thermally hardened. In another configuration where the bonding member 3 hardens over time, the bonding member 3 is hardened over time.

Each of members including the main circuit board 40 to be contained within the cavity 4 of the housing 5 may be placed in either one of the first housing member 10 and the second housing member 20 before the first housing member 10 and the second housing member 20 are assembled together to form the housing 5.

After the first housing member 10 and the second housing member 20 are joined together by the bonding member 3 therebetween, the first housing member 10 and the second housing member 20 are secured to each other with four screws 28. That is, the four screws 28 are inserted into the respective screw holes 10a, 10b, 10c, 10d through the through holes 20a, 20b, 20c, 20d of the second housing member 20.

1-6. Advantages of First Embodiment

The first embodiment can provide advantages (1a)-(1d).

(1a) The housing 5 of the imaging apparatus 1 includes the first housing member 10 and the second housing member 20. The first housing member 10 and the second housing member 20 are joined and electrically connected by the electrically conductive bonding member 3 therebetween. Leakage of electromagnetic waves generated by components inside the housing 5 out of the housing 5 and ingress of external electromagnetic waves into the housing 5 can be prevented.

(1b) In the present embodiment, the bonding member 3 is interposed between the first facing surface 12 of the first housing member 10 and the second facing surface 22 of the second housing member 20 throughout the entire perimeter of the first facing surface 12 and the second facing surface 22. The bonding member 3 is adhered to the first facing surface 12 and the second facing surface 22 throughout the entire perimeter of the first facing surface 12 and the second facing surface 22, which can prevent leakage of electromagnetic waves out of the housing 5 and ingress of external electromagnetic waves into the housing 5.

(1c) The bonding member 3 itself has an adhesive property and can be adhered to the first facing surface 12 and the second facing surface 22. This configuration can increase adhesion of the first facing surface 12 and the second facing surface 22 to the bonding member 3, and is therefore less prone to gap generation between first facing surface 12 and the second facing surface 22.

(1d) Besides the first housing member 10 and the second housing member 20 being joined together by the bonding member 3 therebetween, the first housing member 10 and the second housing member 20 are mechanically secured to each other by a plurality of screws 28. This configuration can increase adhesion of the first facing surface 12 and the second facing surface 22 to the bonding member 3.

2. SECOND EMBODIMENT

An imaging apparatus 50 in accordance with a second embodiment of the present disclosure will now be described with reference to FIGS. 5 and 6. The imaging apparatus 50 includes a housing 55, an imaging module 80, and a main circuit board 90. The housing 55 includes a first housing member 60 and a second housing member 70. Each of the first housing member 60 and the second housing member 70 is an electrical conductor. The housing 55 is an assembly of the first housing member 60 and the second housing member 70. The imaging module 80 and the main circuit board 90 are contained in a cavity 54 of the housing 55.

As compared to the first housing member 10 of the first embodiment, the first housing member 60 differs from the first housing member 10 of the first embodiment only in the shape of the first facing surface. The first housing member 60 includes a first opening 61 and a first opening perimeter 61a that is a perimeter of the first opening 61. The first facing surface 62 is provided throughout the entire first opening perimeter 61a. The first housing member 60 has a lens aperture 64.

As compared to the second housing member 20 of the first embodiment, the second housing member 70 also differs from the second housing member 20 of the first embodiment only in the shape of the second facing surface. The second housing member 70 includes a second opening 71 and a second opening perimeter 71a that is a perimeter of the second opening 71. The second facing surface 72 is provided throughout the entire second opening perimeter 71a. The first housing member 60 has a lens aperture 64.

Figure 5:
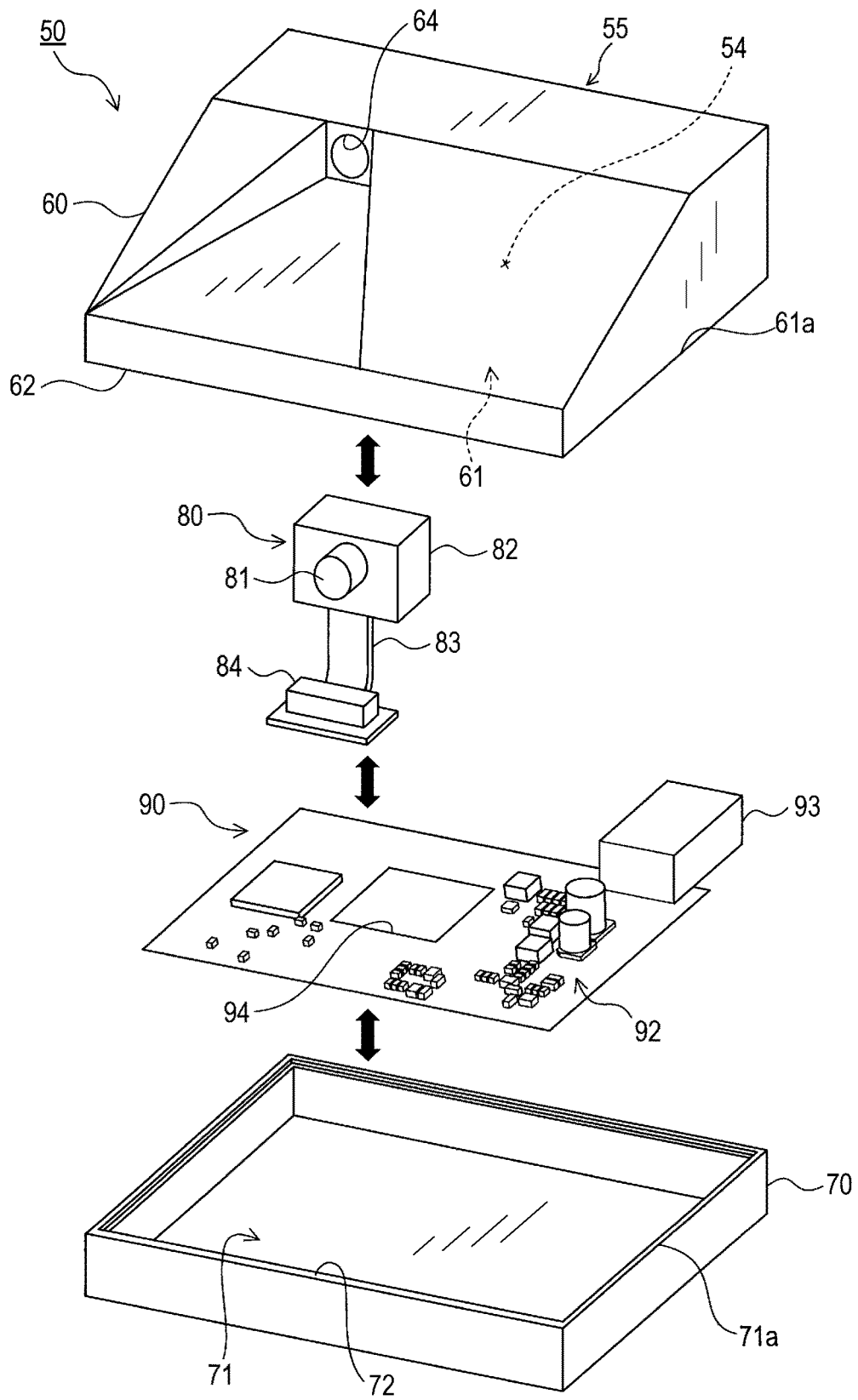
FIG. 5 is an exploded, perspective view of an imaging apparatus in accordance with a second embodiment of the present disclosure.
Figure 6:
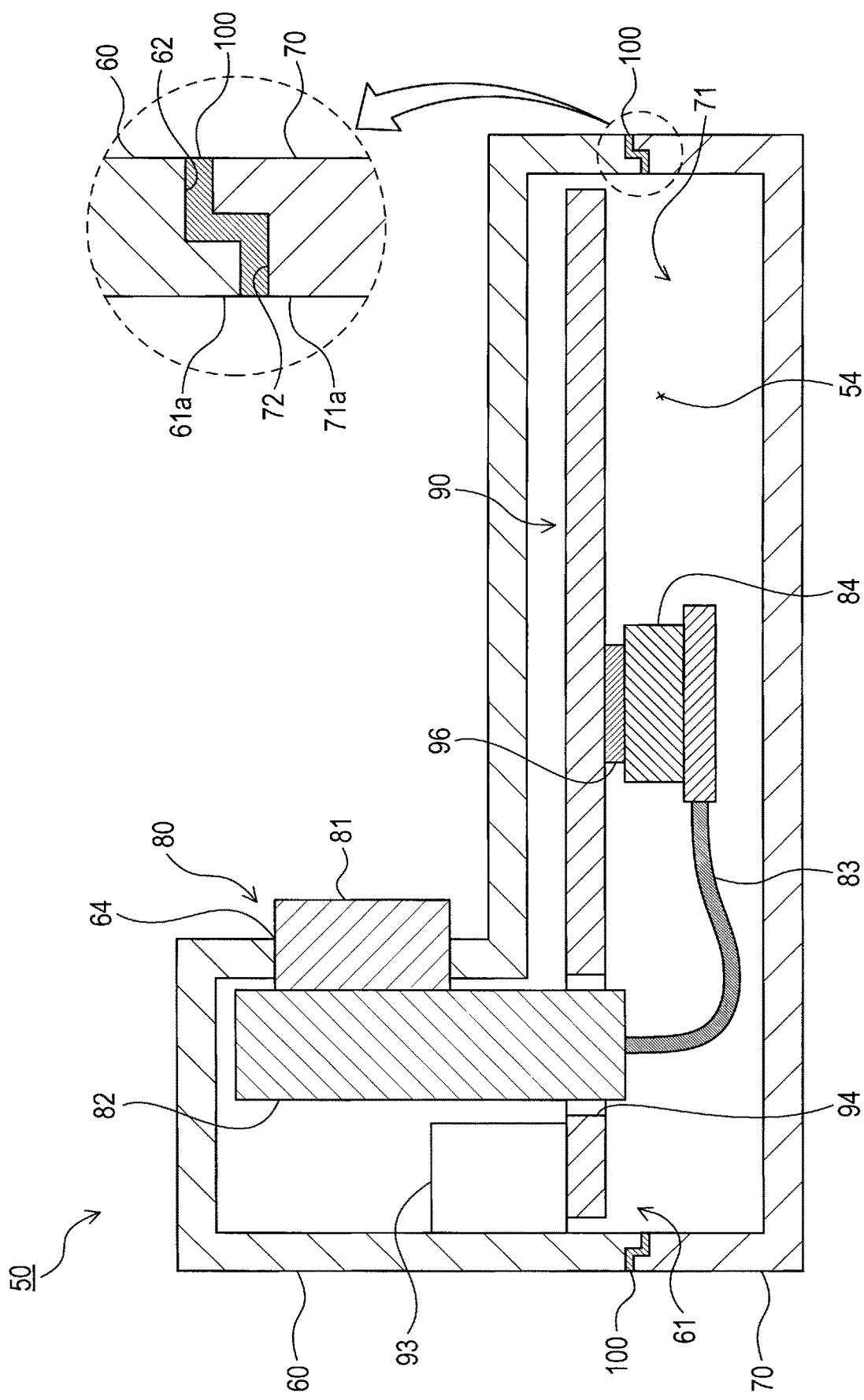
FIG. 6 is a cross-sectional view of the imaging apparatus of the second embodiment.

As shown in FIGS. 5 and 6, each of the first facing surface 62 and the second facing surface 72 has an L-shaped cross-section perpendicular to the circumferential direction. As shown in FIG. 6, a bonding member 100 is interposed between the first facing surface 62 and the second facing surface 72.

Like the bonding member 3 of the first embodiment, the bonding member 100 has an adhesive and electrically conductive property and disposed to face the first facing surface 62 and the second facing surface 72 throughout the entire perimeter of the first facing surface 62 and the second facing surface 72. The bonding member 100 adheres to and electrically connects the first facing surface 62 and the second facing surface 72.

In the present embodiment, the bonding member 100 is initially in paste form and is then thermally hardened. That is, the bonding member 100, as a whole, is an electrically conductive adhesive.

Although not shown in FIGS. 5 and 6, the first housing member 60 and the second housing member 70 are also secured to each other by a plurality of screws as in the first embodiment.

The imaging module 80 includes a lens 81 and an imaging substrate 82. The lens 81 is similar to the lens 31 of the first embodiment. The imaging substrate 82 is similar to the imaging substrate 32 of the first embodiment.

As in the first embodiment, the imaging module 80 is contained within the cavity 54 of the housing 55. Part of the lens 81 is exposed externally of the housing 55 from the lens aperture 44.

The imaging module 80 further includes a cable 83 and a module connector 84. The cable 83 may be a flat-type cable such that a plurality of flat cables are arranged in a generally co-planar fashion. Image signals generated in the signal output circuit of the imaging substrate 82 is transmitted to the module connector 84 via the cable 83, and in turn, output from the module connector 84.

Like the main circuit board 40 of the first embodiment, the main circuit board 90 includes a signal processing circuit 92 and an external connector 93. The signal processing circuit 92 and the external connector 93 are respectively similar in both configuration and function to the signal processing circuit 42 and the external connector 43 of the first embodiment.

Part of the signal processing circuit 92 and the external connector 93 are provided on an upper board surface of the main circuit board 90. As shown in FIG. 6, a board connector 96 is provided on a lower board surface of the main circuit board 90. The board connector 96 is electrically connected to the signal processing circuit 92.

The board connector 96 is mated with the module connector 84 of the imaging module 80. That is, the main circuit board 90 is electrically connected to the imaging module 80 through the imaging substrate 82, the board connector 96, and the module connector 84, such that various signals are transmitted and received between the main circuit board 90 and the imaging module 80.

In the present embodiment, the main circuit board 90 has an aperture 94 therethrough. Part of the imaging module 80 is inserted inside the aperture 94 of the main circuit board 90. In present embodiment, as shown in FIG. 6, the imaging module 80 is disposed with part of the imaging substrate 82 inserted inside the aperture 94 of the main circuit board 90.

The majority of the imaging module 80 excluding part thereof is disposed on a top side of the main circuit board 90. The board connector 96 is disposed on a bottom side of the main circuit board 90. In such a positional relationship, as shown in FIG. 6, the imaging module 80 is connected to the board connector 96 of the main circuit board 90 via the aperture 94.

Which part of the imaging module 80 is placed inside the aperture 94 of the main circuit board 90 may suitably be determined. For example, the entire imaging substrate 82 may be disposed on the top side of the main circuit board 90, and the cable 83 may be disposed to pass through the aperture 94 of the main circuit board 90.

In the present embodiment, the assembling procedure of the housing 55 may be as follows. The paste-like bonding member 100 is applied to either one of the first facing surface 62 of the first housing member 60 and the second facing surface 72 of the second housing member 70.

Subsequently, the first housing member 60 and the second housing member 70 are combined such that the first facing surface 62 and the second facing surface 72 face each other, such that the first facing surface 62 and the second facing surface 72 are both adhered to the bonding member 100.

In this position, a thermal hardening treatment is applied to the bonding member 100. After application of the thermal hardening treatment, the first housing member 60 and the second housing member 70 are secured to each other by a plurality of screws (not shown).

The second embodiment set forth above in detail can provide not only the advantages (1a)-(1d) of the first embodiment, but also the following advantages.

That is, the first facing surface 62 and the second facing surface 72 have an L-shaped cross-section perpendicular to the circumferential direction. Therefore, in the assembling procedure, the proper, horizontal, relative positional relationship between the first housing member 60 and the second housing member 70 can readily be achieved. Even after completion of the assembling procedure, the horizontal, relative positional relationship can properly be maintained without using the screws.

3. OTHER EMBODIMENTS

It is to be understood that the invention is not to be limited to the specific embodiments disclosed above and that modifications and other embodiments are intended to be included within the scope of the appended claims.

(3-1) The first facing surface and the second facing surface have a flat shape in the first embodiment. The first facing surface and the second facing surface have an L-shaped cross-section in the second embodiment. In an alternative embodiment, the first facing surface and the second facing surface have a different shape.

For example, a groove having an arc-like cross-section may circumferentially be formed on at least one of the first facing surface and the second facing surface. A ring-shaped bonding member may be laid in the groove, whereby the first facing surface and the second facing surface are adhered to each other with the bonding member interposed therebetween.

Figure 7:
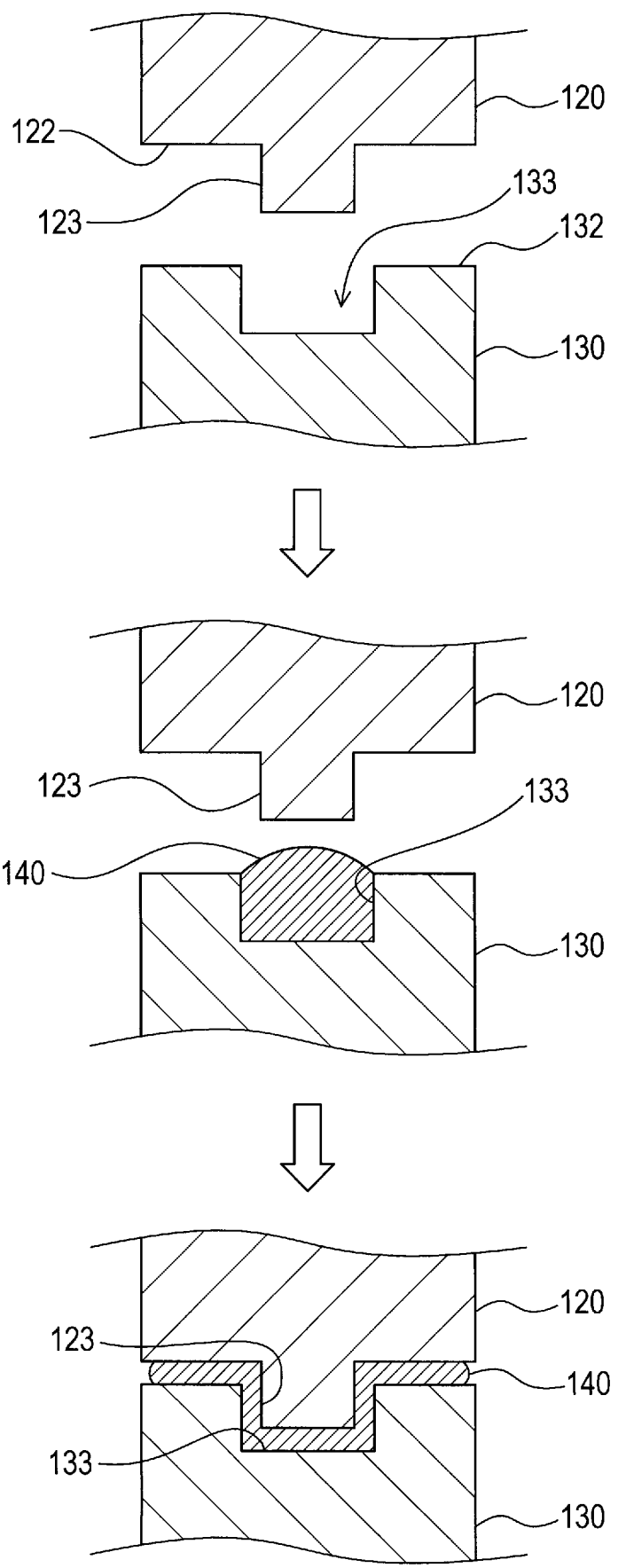
FIG. 7 is an example of assembling a first housing member and a second housing member together.
Figure 8:
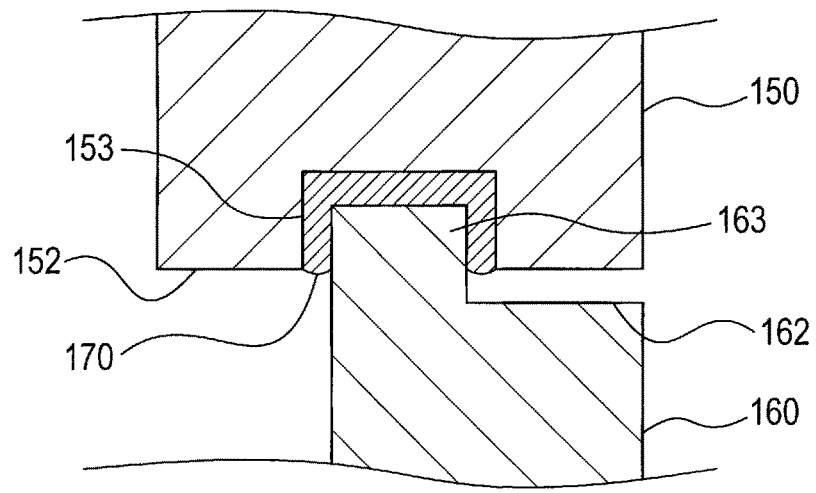
FIG. 8 is another example of assembling a first housing member and a second housing member together.

In another alternative embodiment, a rib-shaped protrusion may circumferentially be formed on one of the first facing surface and the second facing surface, and a groove may be formed on the other of the first facing surface and the second facing surface, such that the rib-shaped protrusion is inserted inside the groove with the bonding member filled in the groove. FIGS. 7 and 8 illustrates an example.

FIG. 7 illustrates an example of the imaging apparatus, where a rib protrusion 123 is circumferentially formed on the first facing surface 122 of the first housing member 120 and a groove 133 is circumferentially formed on the second facing surface 132 of the second housing member 130.

The protrusion 123 of the first housing member 120 protrudes toward the second facing surface 132. The groove 133 of the second facing surface 132 is positioned opposite the protrusion 123 to be inserted into the protrusion 123 with the bonding member 140 filled in the groove 133.

Referring to FIG. 7, a procedure of assembling the first housing member 120 and the second housing member 130 to form the imaging apparatus is as follows. As shown at the top of FIG. 7, the first housing member 120 and the second housing member 130 are spaced apart from each other in a not yet assembled state.

As shown in the middle of FIG. 7, a paste-like, soft bonding member 140 is filled in the groove 133 of the second housing member 130.

After filling the groove 133 with the bonding member 140, the first housing member 120 is put onto the second housing member 130 such that the protrusion 123 of the first housing member 120 is inserted into the groove 133 of the second housing member 130.

After insertion of the protrusion 123 of the first housing member 120 into the groove 133 of the second housing member 130, the protrusion 123 of the first housing member 120 is embedded in the bonding member 140 filled in the groove 133, as shown in the bottom of FIG. 7. As set forth above, in the present example, the bonding member 140 is filled in the groove 133 to completely close the groove 133. Therefore, as shown in the bottom of FIG. 7, as the protrusion 123 is inserted into the groove 133, part of the bonding member 140 will run out of the groove 133.

As shown in the bottom of FIG. 7, a thermal hardening treatment is applied to the bonding member 140 with at least part of the protrusion 123 inserted inside the groove 133 as shown in the bottom of FIG. 7. To what extent the protrusion 123 is to be inserted into the groove 133 may be determined as appropriate. For example, the protrusion 123 may be inserted into the groove 133 until the tip of the protrusion 123 reaches the bottom of the groove 133 or until the first facing surface 122 gets in contact with the second facing surface 132.

FIG. 8 illustrates another example of the imaging apparatus, where a second facing surface 162 of a second housing member 160 has an L-shaped cross-section as in the second embodiment, and a groove 153 is circumferentially formed on a first facing surface 152 of a first housing member 150. With this configuration, as shown in FIG. 8, an exterior surface of the first housing member 150 and an exterior surface of the second housing member 160 are substantially flush with each other. Meanwhile, an interior surface of the first housing member 150 and an interior surface of the second housing member 160 are not flush with each other.

Referring to FIG. 8, a procedure of assembling the first housing member 150 and the second housing member 160 to form the imaging apparatus is as follows. First, a paste-like, soft bonding member 170 is filled in the groove 153 of the first housing member 150. After filling the groove 153 with the bonding member 170, the first housing member 150 is put onto the second housing member 160 such that at least part of the protrusion 163 of the second housing member 160 is inserted inside the groove 153 of the first housing member 150.

After insertion of the protrusion 163 of the second housing member 160 into the groove 153 of the first housing member 150, the protrusion 153 of the second housing member 160 is embedded in the bonding member 170 filled in the groove 153, as shown in the bottom of FIG. 8. Depending on a filled amount of bonding member 170 in the groove 153 or an embedded amount of the protrusion 163 in the bonding member 170, part of the bonding member 170 may run out of the groove 153. Thereafter, a thermal hardening treatment is applied to the bonding member 170 with at least part of the protrusion 163 inserted inside the groove 153 as shown in FIG. 8.

(3-2) In the embodiments set forth above, each facing surface is provided throughout the entire opening perimeter. In an alternative embodiment, each facing surface may not be provided throughout the entire opening perimeter. In the embodiments set forth above, the bonding member is provided throughout the entire opening perimeter. In an alternative embodiment, the bonding member may not be provided throughout the entire opening perimeter. For example, the bonding member may be provided between the first facing surface and the second facing surface only along part of the opening perimeter. For example, the bonding member may be provided between the first facing surface and the second facing surface such that there are one or more spaces free from the bonding member between the first facing surface and the second facing surface.

In such an embodiment, the bonding member may be provided between the first facing surface and the second facing surface such that any space free from the bonding member between the first facing surface and the second facing surface has a circumferential length of less than one-half of a signal wavelength, that is, $\lambda/2$ as set forth above.

(3-3) In the embodiments set forth above, the bonding member has an adhesive property. In an alternative embodiment, the bonding member may have no adhesive property to both the first facing surface and the second facing surface. For example, the bonding member may have an adhesive property to one of the first facing surface and the second facing surface, and the bonding member may only have to be in intimate contact with the other of the first facing surface and the second facing surface.

(3-4) In the embodiments set forth above, the bonding member as a whole has an adhesive property. In an alternative embodiment, the bonding member may not have an adhesive property as a whole, or the bonding member may have a laminated structure formed of a plurality of layers. The bonding member may have a laminated structure formed of a layer including no adhesive or a low adhesive content, and an adhesive-based layer.

Figure 9:
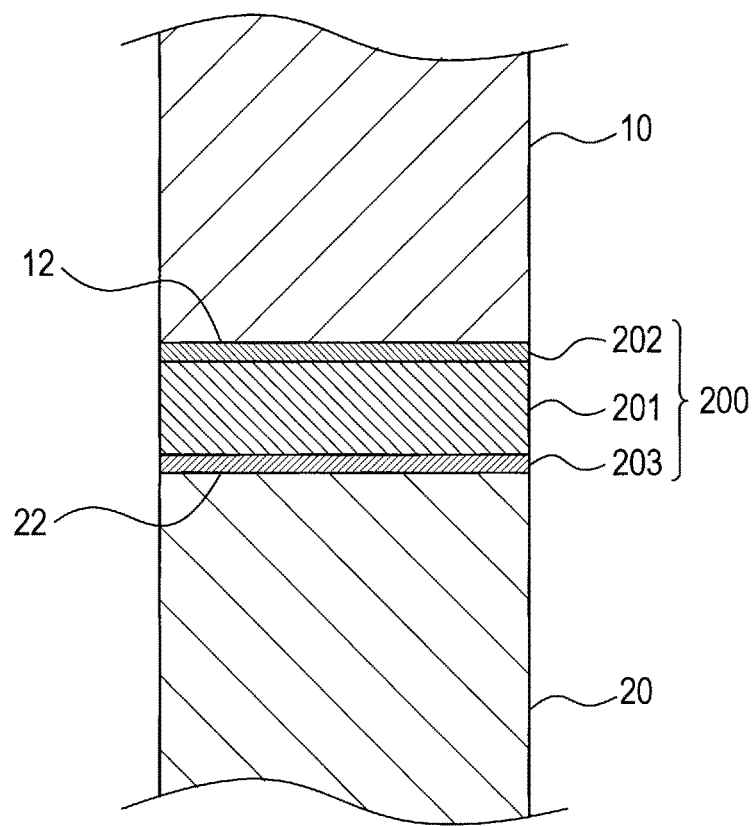
FIG. 9 is another example of assembling a first housing member and a second housing member together.

FIG. 9 illustrates an example of such a laminated structure of the bonding member as an alternative to the bonding member 3 of the imaging apparatus 1 of the first embodiment. In FIG. 9, the bonding member 200 has a laminated structure.

The bonding member 200 shown in FIG. 9 is formed of an interlayer 201, a first adhesive layer 202, and a second adhesive layer 203. Each of the interlayer 201, the first bonding layer 202, and the second bonding layer 203 is an electrically conductive member.

The interlayer 201 may have no adhesive property or a low adhesive content. Each of the first adhesive layer 202 and the second adhesive layer 203 has an adhesive with a higher adhesive property than the interlayer 201.

The first adhesive layer 202 is in contact with and adhered to the first facing surface, thereby causing the interlayer 201 to adhere to the first facing surface. The first adhesive layer 202 causes the bonding member to adhere to the first facing surface.

The second adhesive layer 203 is in contact with and adhered to the second facing surface, thereby causing the interlayer 201 to adhere to the second facing surface. The second adhesive layer 203 causes the bonding member to adhere to the second facing surface.

In the bonding member 200 shown in FIG. 9, either one of the first adhesive layer 202 and the second adhesive layer 203 may be removed.

In the bonding member 200 shown in FIG. 9, the interlayer 201 may also have an adhesive property. For example, the interlayer 201 may be formed of the same material as the bonding member 3 of the first embodiment.

Both of the bonding member 3 itself of the first embodiment and the bonding member 100 itself of the second embodiment have an adhesive property. Therefore, each of the bonding members 3, 100 as a whole is an adhesive layer with an adhesive property.

(3-5) In the first embodiment, four screws 28 are used as fasteners. The number of screws is not limited to four. The number of screws may be greater or less than four. In addition, positions of the fasteners may be arbitrarily determined.

Fasteners other than screws may be used to mechanically secure the first housing member and the second housing member to each other. For example, as fasteners, crimp engagement or snap fit engagement may be applied to secure the first housing member and the second housing member to each other at at least one portion of the at least one portion along the perimeter of the opening of each of the first and second housing members.

(3-6) To secure the first housing member and the second housing member to each other, the bonding member only has to have an adhesive property, where both the first and second housing members may be secured only with the adhesive property of the bonding member, without using fasteners, such as screws.

(3-7) In the embodiments set forth above, the imaging apparatus includes only one imaging module. In an alternative embodiment, the imaging apparatus may include a plurality of imaging modules.

(3-8) A shape, a structure, and other features of the opening perimeter of each of the first housing member and the second housing member are not limited to those described in the above embodiments. In each of the above embodiments, the first housing member and the second housing member are formed of an aluminum-based material. In an alternative embodiment, the first housing member and the second housing member may be formed of another-metal-based material other than the aluminum-based material.

(3-9) The functions of a single component may be distributed to a plurality of components, or the functions of a plurality of components may be integrated into a single component. At least part of the configuration of the above embodiments may be replaced with a known configuration having a similar function. At least part of the configuration of the above embodiments may be removed. At least part of the configuration of one of the above embodiments may be replaced with or added to the configuration of another one of the above embodiments. While only certain features of the invention have been illustrated and described herein, many modifications and changes will occur to those skilled in the art. It is, therefore, to be understood that the appended claims are intended to cover all such modifications and changes as falling within the true spirit of the invention.

What is claimed is:

1. An imaging apparatus mounted in a vehicle, the imaging apparatus comprising:
    a housing having a cavity thereinside;
    an imaging module that is at least partially contained in the cavity and configured to capture an image of an imaging target and output an image signal representing the image of the imaging target;
    a circuit board contained entirely within the cavity and including a signal processor configured to process the image signal output from the imaging module,
    wherein the housing comprises:
    a first housing member having an opening and a first facing surface along a perimeter of the opening;
    a second housing member disposed to cover the opening, the second housing member having a second facing surface facing the first facing surface; and
    an electrically conductive bonding member separate from the circuit board, the electrically conductive bonding member being disposed between the first facing surface and the second facing surface and in close contact with both the first facing surface and the second facing surface at least partially along the perimeter of the opening, and adapted to electrically connect the first housing member and the second housing member,
    wherein
    the electrically conductive bonding member is provided between the first facing surface and the second facing surface such that any space free from the electrically conductive bonding member between the first facing surface and the second facing surface has a circumferential length of less than one-half of a specific signal wavelength, and
    the specific signal wavelength is a wavelength of a highest frequency signal among various signals used in vehicle mounted devices.

2. The imaging apparatus according to claim 1, wherein the electrically conductive bonding member is interposed between the first facing surface of the first housing member and the second facing surface of the second housing member throughout the entire perimeter of the opening.

3. The imaging apparatus according to claim 1, wherein the electrically conductive bonding member is adhered to at least one of the first facing surface of the first housing member and the second facing surface of the second housing member.

4. The imaging apparatus according to claim 3, wherein the electrically conductive bonding member comprises an adhesive layer that is in contact with at least one of the first facing surface and the second facing surface and configured to cause the electrically conductive bonding member to adhere to the at least one of the first facing surface and the second facing surface.

5. The imaging apparatus according to claim 1, wherein one of the first facing surface and the second facing surface has a protrusion formed circumferentially along the one of the first facing surface and the second facing surface, the protrusion protruding toward the other of the first facing surface and the second facing surface, and the other of the first facing surface and the second facing surface has a groove positioned opposite the protrusion such that the protrusion is inserted into the groove and at least part of the electrically conductive bonding member filled in the groove.

6. The imaging apparatus according to claim 1, further comprising at least one fastener other than the bonding member, the at least one fastener being configured to secure the first housing member and the second housing member to each other.

7. An imaging apparatus mounted in a vehicle, the imaging apparatus comprising:
a housing having a cavity thereinside;
an imaging module that is at least partially contained in the cavity and includes a light input on which light from an imaging target is incident, the imaging module being configured to output an image signal representing the image of the imaging target based on the light from the imaging target incident on the light input;
a circuit board contained entirely within the cavity and including a signal input configured to receive the image signal from the imaging module and a signal processing circuit configured to process the image signal received by the signal input, the circuit board having an aperture through the circuit board,
wherein at least the light input of the imaging module is disposed on one of opposite sides of the circuit board, the signal input is disposed on the other of opposite sides of the circuit board, the imaging module and the signal input are electrically connected via the aperture of the circuit board,
wherein the housing comprises:
a first housing member having a first opening and a first facing surface along a perimeter of the first opening;
a second housing member disposed to cover the first opening, the second housing member having a second opening facing the first opening and a second facing surface facing the first facing surface along a perimeter of the second opening; and
an electrically conductive bonding member separate from the circuit board, the electrically conductive bonding member being disposed between the first facing surface and the second facing surface and in close contact with both the first facing surface and the second facing surface, and adapted to electrically connect the first housing member and the second housing member,
wherein
the electrically conductive bonding member is provided between the first facing surface and the second facing surface such that any space free from the electrically conductive bonding member between the first facing surface and the second facing surface has a circumferential length of less than one-half of a specific signal wavelength, and
the specific signal wavelength is a wavelength of a highest frequency signal among various signals used in vehicle mounted devices.

8. The imaging apparatus according to claim 7, wherein the circuit board comprises a connector provided thereon for receiving external signals to be input to the signal processing circuit and outputting processing results from the signal processing circuit,
the first housing member has an aperture that the connector fits into.

9. The imaging apparatus according to claim 1, wherein the one-half of the specific signal wavelength is about 60 mm corresponding to a signal frequency of 2.5 GHz.

10. The imaging apparatus according to claim 1, wherein the circuit board comprises a connector provided thereon for receiving external signals to be input to the signal processor and outputting processing results from the signal processor,
the first housing member has an aperture that the connector fits into.

11. An imaging apparatus mounted in a vehicle, the imaging comprising:
a housing having a cavity thereinside;
an imaging module that is at least partially contained in the cavity and configured to capture an image of an imaging target and output an image signal representing the image of the imaging target;
a circuit board contained entirely within the cavity and including a signal processor configured to process the image signal output from the imaging module,
wherein the housing comprises:
a first housing member having an opening and a first opening perimeter that is a perimeter of the opening;
a second housing member disposed facing the opening and having a second opening perimeter formed along the first opening perimeter; and
an electrically conductive bonding member separate from the circuit board and adapted to closely fit between the first opening perimeter and the second opening perimeter at least partially along the perimeter of the opening and electrically connect the first housing member and the second housing member,
wherein
the electrically conductive bonding member is provided between the first opening perimeter and the second opening perimeter such that any space free from the electrically conductive bonding member between the first opening perimeter and the second opening perimeter has a circumferential length of less than one-half of a specific signal wavelength, and
the specific signal wavelength is a wavelength of a highest frequency signal among various signals used in vehicle mounted devices.

12. The imaging apparatus according to claim 11, wherein the circuit board comprises a connector provided thereon for receiving external signals to be input to the signal processor and outputting processing results from the signal processor,
the first housing member has an aperture that the connector fits into.

* * * * *